(12) United States Patent
Xiao

(10) Patent No.: US 9,362,490 B1
(45) Date of Patent: Jun. 7, 2016

(54) METHOD OF PATTERNING MTJ CELL WITHOUT SIDEWALL DAMAGE

(71) Applicant: Rongfu Xiao, Dublin, CA (US)

(72) Inventor: Rongfu Xiao, Dublin, CA (US)

(*) Notice: Subject to any disclaimer, the term of this patent is extended or adjusted under 35 U.S.C. 154(b) by 0 days.

(21) Appl. No.: 14/794,804

(22) Filed: Jul. 9, 2015

(51) Int. Cl.
*H01L 43/12* (2006.01)
*H01L 43/02* (2006.01)
*H01L 43/08* (2006.01)

(52) U.S. Cl.
CPC .............. *H01L 43/12* (2013.01); *H01L 43/02* (2013.01); *H01L 43/08* (2013.01)

(58) Field of Classification Search
None
See application file for complete search history.

(56) References Cited

U.S. PATENT DOCUMENTS

| | | | | |
|---|---|---|---|---|
| 2013/0244344 A1* | 9/2013 | Malmhall | ............ | B82Y 10/00 438/3 |
| 2013/0267042 A1* | 10/2013 | Satoh | ............ | H01L 43/12 438/3 |
| 2014/0116984 A1* | 5/2014 | Ding | ............ | G11B 5/3163 216/22 |
| 2014/0170776 A1* | 6/2014 | Satoh | ............ | H01L 43/12 438/3 |

* cited by examiner

*Primary Examiner* — Yasser A Abdelaziez
(74) *Attorney, Agent, or Firm* — 5Suns; Yuanhui Hunag

(57) ABSTRACT

A method of removing a damaged magnetic layer at the sidewall of MTJ edge is provided to form damage-free MRAM cell. In this method, the MTJ film stack outside the Ta hard mask protected area is first etched by high-power magnetic reactive ion etch (RIE) using methanol (CH3OH) or Co & NH3 as etchant gases. Then a very mild chemical vapor trimming (CVT) process is used to remove a damaged layer (by the high power RIE) from the MTJ sidewall followed by an in-situ edge passivation with Si nitride (SiN) layer formed by PECVD. The MRAM cell formed by such method will have higher magnetoresistance with good device performance and better reliability.

14 Claims, 10 Drawing Sheets

Present Invention

Chemical vapor trimming (CVT) for extracting particles 125 of etch resulted wear and tear damages on surfaces and edges of MTJ cells Normal MTJ photolithography patterning Normal etch by CH3OH or CO & NH3 with a damaged layer surrounding MTJ edge

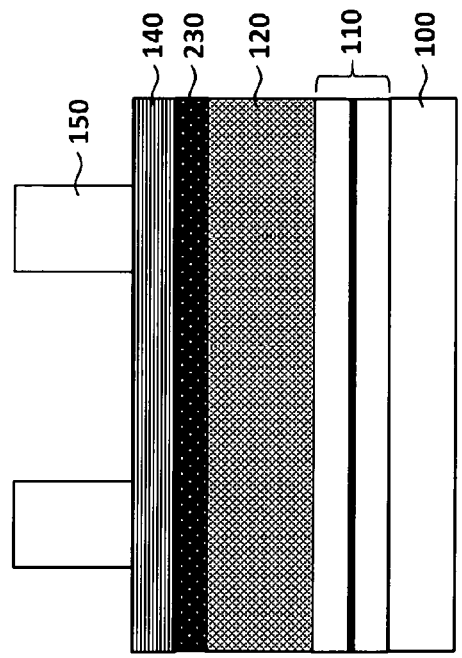
FIG. 3. Present Invention
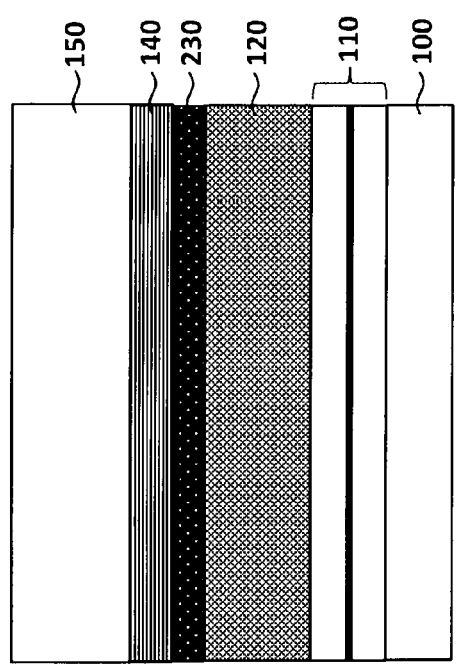
FIG. 4. Present Invention
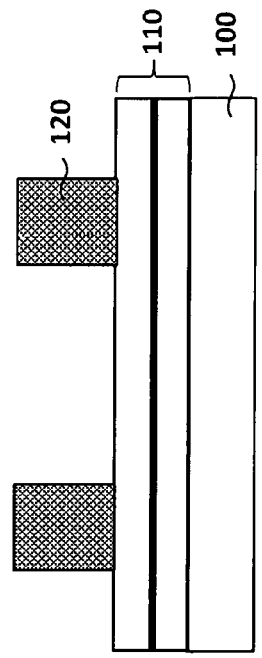
FIG. 6. Present Invention
Patterned Ta hard mask 120
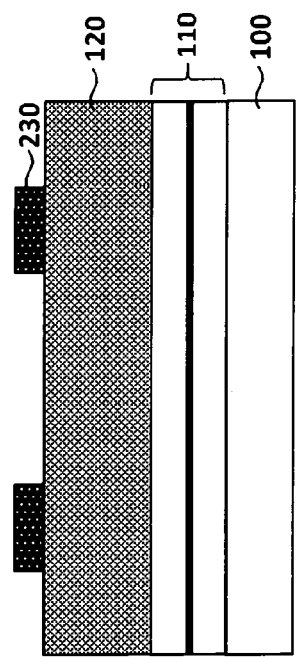
FIG. 5. Present Invention

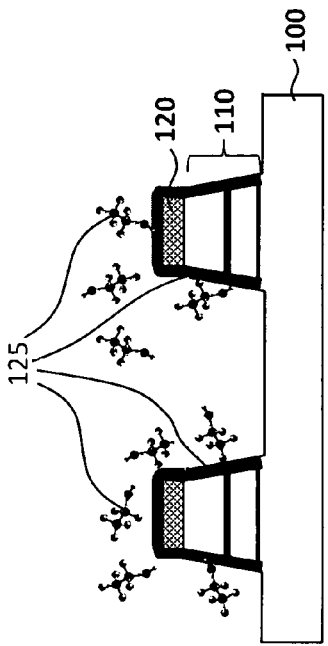

FIG. 7. Present Invention

Normal MTJ etch by CH3OH or CO & NH3 with a damaged layer 125 surrounding MTJ cells before CVT in present invention

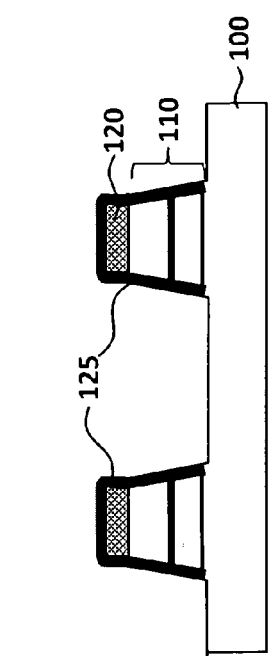

FIG. 8. Present Invention

Chemical vapor trimming (CVT) for extracting particles 125 of etch resulted wear and tear damages on surfaces and edges of MTJ cells

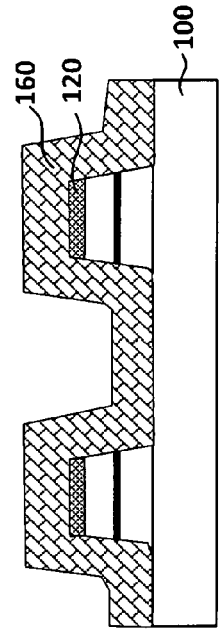

FIG. 9. Present Invention

MTJ cells after removal of the layer of etch resulted wear and tear damages surrounding MTJ cells

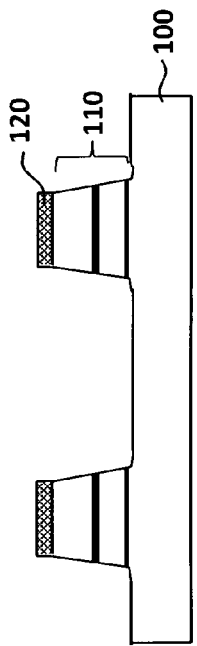

FIG. 10. Present Invention

MTJ cell in-situ passivation by SiN 160

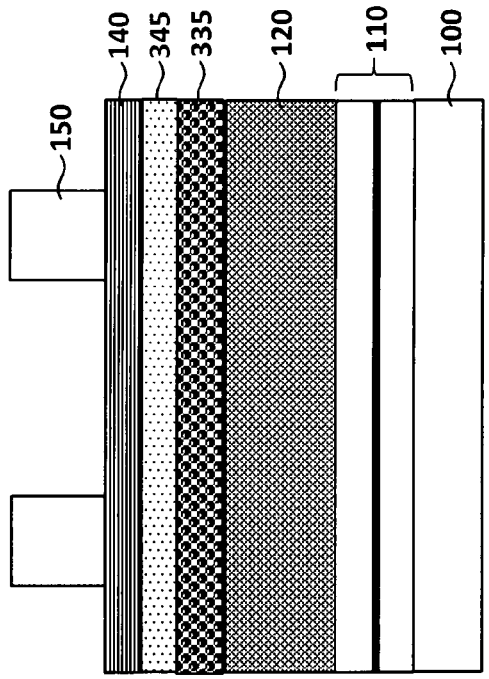
FIG. 11. Present Invention
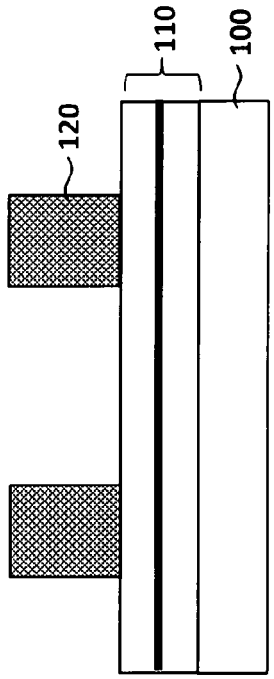
FIG. 12. Present Invention
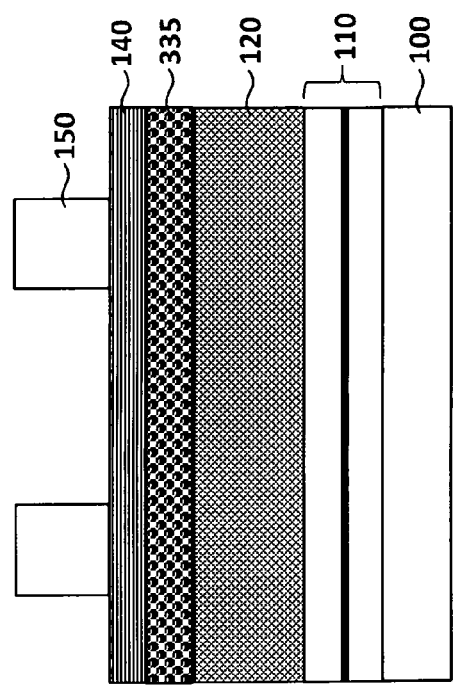
FIG. 13. Present Invention
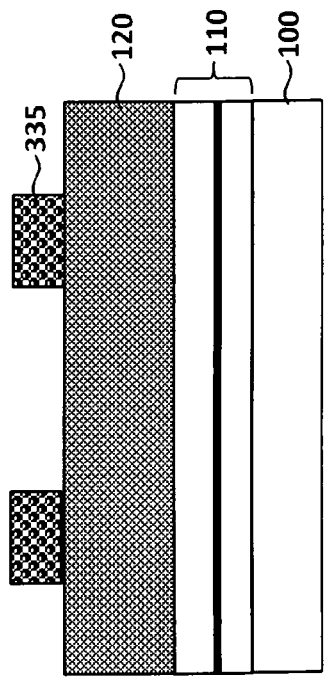
FIG. 14. Present Invention

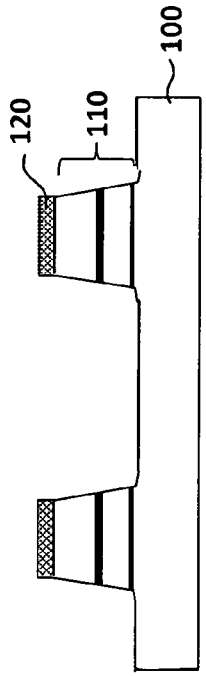
FIG. 16. Present Invention
MTJ cells after removal of the layer of etch resulted wear and tear damages surrounding MTJ cells
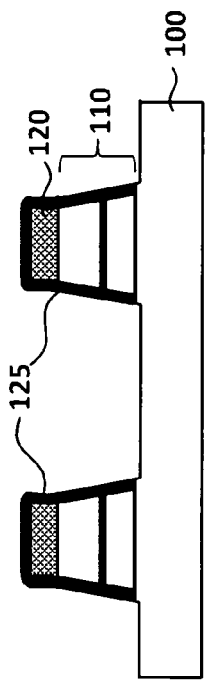
FIG. 15. Present Invention
Wear and tear damage layer 125 caused by a etch process, surrounding MTJ cells before CVT in present invention

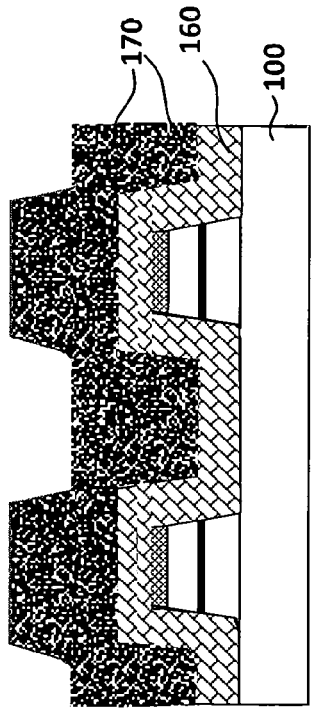
FIG. 17. Present Invention
MTJ cell in-situ passivation by SiN 160
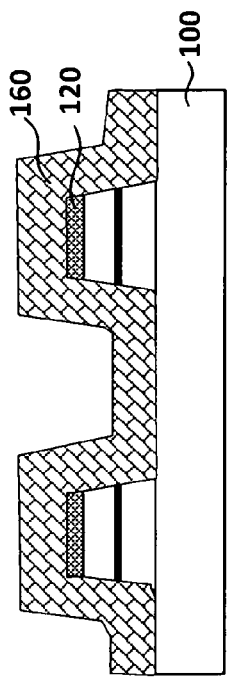
FIG. 18. Present Invention
A SiO2 layer 170 is deposited on top of SiN
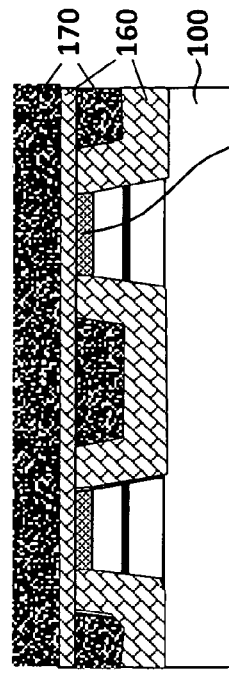
FIG. 19. Present Invention
After SiO2 170 filling and CMP
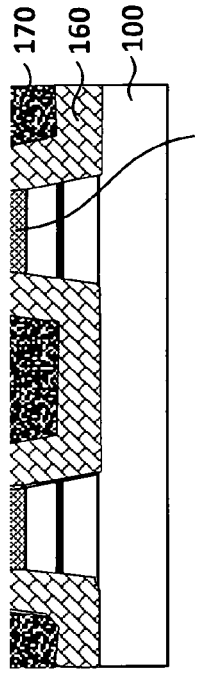
FIG. 20. Present Invention
A pair of SiN 160 and SiO2 170 deposited

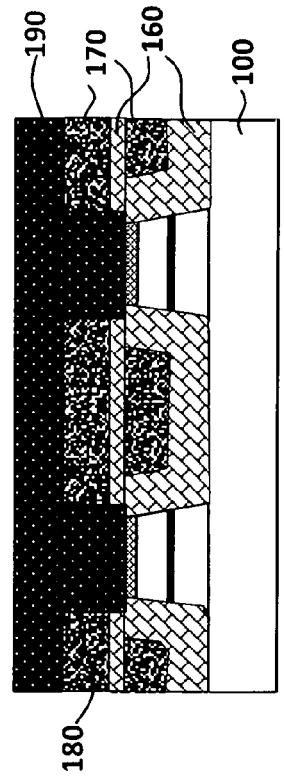
FIG. 23. Present Invention
After forming TEV and TE
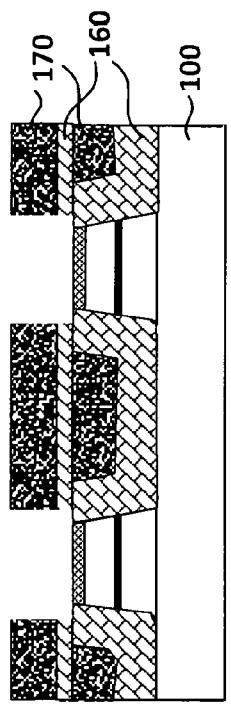
FIG. 21. Present Invention
After patterning for forming TEV
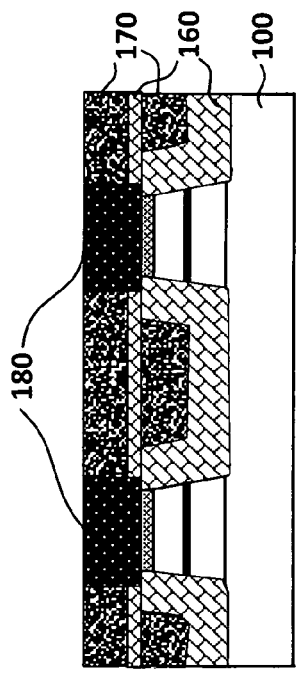
FIG. 22. Present Invention
After forming TEV

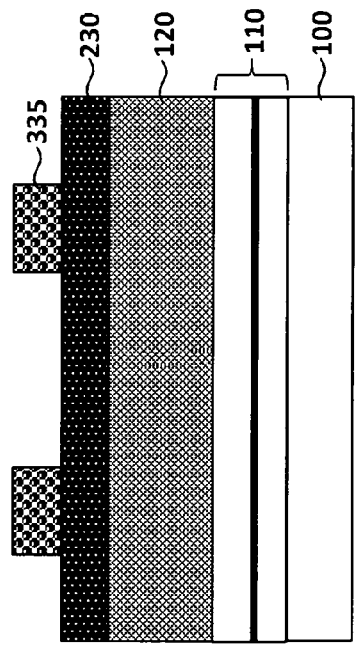
FIG. 24. Present Invention
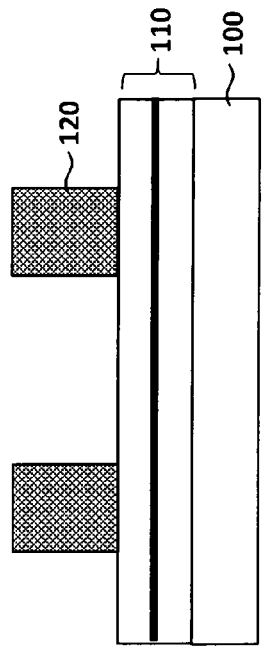
FIG. 25. Present Invention
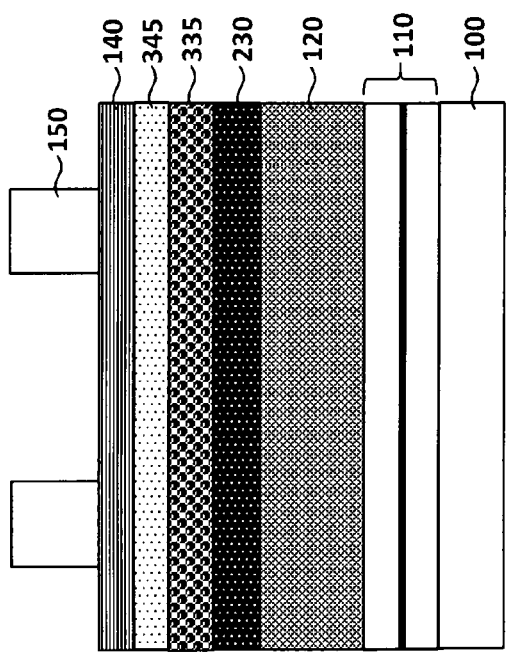
FIG. 26. Present Invention
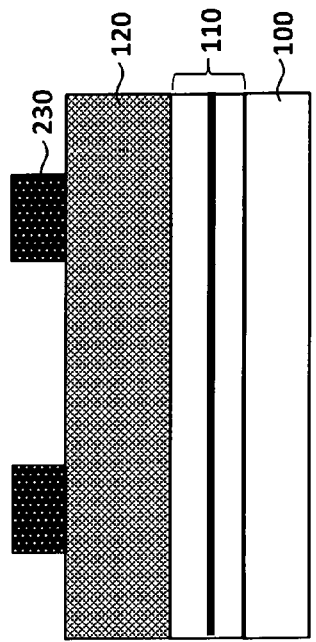
FIG. 27. Present Invention

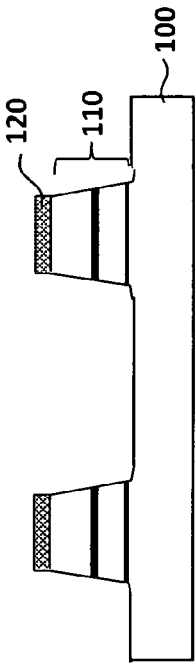
FIG. 29. Present Invention
MTJ cells after removal of the layer of etch resulted wear and tear damages surrounding MTJ cells
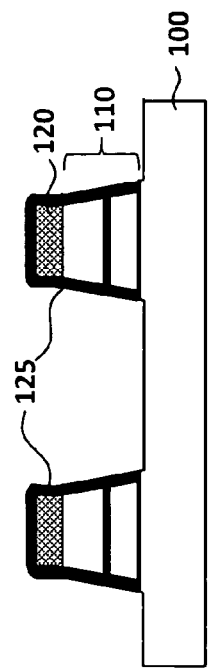
FIG. 28. Present Invention
Wear and tear damage layer 125 caused by a etch process, surrounding MTJ cells before CVT in present invention

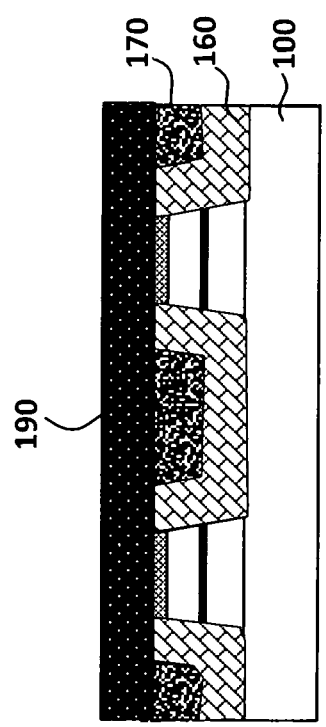
FIG. 30. Present Invention
After TE patterning without TEV

METHOD OF PATTERNING MTJ CELL WITHOUT SIDEWALL DAMAGE

BACKGROUND OF THE INVENTION

1. Field of the Invention

This invention relates generally to a method of patterning magnetic random access memory (MRAM) cells without sidewall damage using two-step etching & trimming processing.

2. Description of the Related Art

In recent years, magnetic random access memories (hereinafter referred to as MRAMs) using the magnetoresistive effect of a ferromagnetic tunnel junction, also called magnetic tunnel junction (MTJ), have been drawing increasing attention as the next-generation solid-state nonvolatile memories that can cope with high-speed reading and writing, large capacities, and low-power-consumption operations. A ferromagnetic tunnel junction has a three-layer stack structure formed by stacking a recording layer having a changeable magnetization direction, an insulating spacing layer, and a fixed layer that is located on the opposite side from the recording layer and maintains a predetermined magnetization direction.

To record information in such magnetoresistive elements, there has been suggested a write method using spin momentum transfers or spin torque transfer (STT) switching technique, or the so-called STT-MRAM. Depending on the direction of magnetic polarization, STT-MRAM is further clarified as in-plane STT-MRAM and perpendicular pSTT-MRAM, among which pSTT-MRAM is preferred. According to this method, the magnetization direction of a recording layer is reversed by applying a spin-polarized current to a magnetoresistive element. Furthermore, as the volume of the magnetic layer forming the recording layer is reduced, the injected spin-polarized current to write or switch can be also smaller. Accordingly, this method is expected to be a write method that can achieve both device miniaturization and currents reduction.

Patterning a MTJ cell, in a prior art, is by reactive ion etching using CH3OH or CO & NH3 as etchant gases (see U.S. Pat. No. 7,060,194 and U.S. Pat. No. 7,936,027). Very good junction profile (almost or virtually vertical) can be achieved and the etching process is pretty fast. However, there is a damaged layer surrounding a MTJ cell due to high energy ion beam of bombardment. The magnetic property is severely worsened while still electrically conducting, which results in a lower TMR value.

For avoiding such sidewall damages on a MTJ, an alternative way of neutral beam etching was introduced (see U.S. Pat. No. 8,722,543 and ECS Transactions, 35 (4)701-716 (2011) 10.1149/1.3572314 © The Electrochemical Society). However, the entire process is very slow.

Recently developed oxygen neutral beam process technology has attracted attention as a way of solving sidewall damages on a MTJ. A neutral beam suppresses the incidence of charged particles and UV photon radiation onto a device in process, and is able to expose the device only to energy controlled neutral beam (neutral beam motion energy can be precisely controlled by ion acceleration energy with the applied electric field before neutralization), resulting in ultra-precise nanoprocessing that can suppress the formation of defects at the atomic layer level and control surface chemical reactions with high precision. Since the energized particles that inhibit the metal complex reactions, such as ultraviolet rays and electrons are completely cut off, the metal complex reaction is possible even at room temperature in a neutral beam process. As a result, the etching shape by oxidation and complex reaction of the transition metal Ta, Ru, or a Pt becomes ideal shape to the mask as the deterioration of the magnetic properties of the magnetic body which is observed in the plasma etching in the magnetic properties and that was also found that it is possible to suppress completely.

Device using this technology can be implemented in conventional plasma sources, simply by adding a graphite grit for neutralization. It is that the future, and to promote a great deal of device development practical in advancing the research and development of surface modification-modification techniques that does not stop the processing technology in the MRAM manufacturing, using a neutral particle beam.

The above development is found in a publication by X. Gu, Y. Kikuchi, T. Nozawa and S. Samukawa, "A Novel Metallic Complex Reaction Etching for Transition Metal and Magnetic Material by Low-temperature and Damage-free Neutral Beam Process for Non-volatile MRAM Device Applications", VLSI Technology Symposium, Session 6 Process Technology I, No. 6.5 Jun. 10, 2014 and in US Patent Application No. 2014/0291288.

BRIEF SUMMARY OF THE PRESENT INVENTION

A method of making a MTJ cell without sidewall damage by removing wear and tear resulted from a patterning process, on surfaces and edges including side walls of a MTJ is provided here. In this method, a MTJ film stack outside the Ta hard mask protected area is first etched by high-power magnetic reactive ion etch (RIE) using methanol (CH3OH) or Co & NH3 as etchant gases. Then a very mild chemical vapor trimming (CVT) process is used to remove the wear and tear resulted from a patterning process, on surfaces and edges including sidewalls of a MTJ (by the high power RIE) followed by an in-situ surface passivation with Si nitride (SiN) layer formed by a process of plasma-enhanced chemical vapor deposition (PECVD). A MTJ or MRAM cell formed by such a method will have higher magnetoresistance with improved device performance and improved reliability.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

BRIEF DESCRIPTION OF THE DRAWINGS

FIG. 3 illustrates a stack film formed in first embodiment of present invention having a Ta/C 120/230 hard mask for MRAM patterning before etching.

FIG. 4 illustrates first embodiment of present invention having a Ta/C 120/230 hard mask for MRAM patterning before etching, where a patterned photoresist layer 150 has been formed.

FIG. 5 illustrates first embodiment of present invention having a C mask 230 after etching for transferring a PR mask 150 to a C layer 230.

FIG. 6 illustrates first embodiment of present invention having a Ta mask 120 after etching for transferring a C mask 230 to a Ta hard layer 120.

FIG. 7 illustrates first embodiment of present invention after etching MTJ cells 110 at a high power using Ta as hard mask 120 with, indicating a damaged layer 125 surrounding a MTJ cell 110.

FIG. 8 illustrates the present invention having a chemical vapor trimming (CVT) extraction on patterned MTJ cells 110.

FIG. 9 illustrates a result from removal of wear and tear damage on surfaces and edges including sidewalls of MTJ cells resulted from a patterning process on MTJ cells after CVT.

FIG. 10 illustrates the present invention making protection of the MTJ cells by a layer of Si nitride (SiN) 160.

FIG. 11 illustrates second embodiment of present invention having a bi-layer of Ta 120 and an etching enhancement layer (EEL) 335, Ta/EEL 120/335, hard mask for MRAM patterning before etching, wherein the EEL 335 is made of one or more of Si oxide (SiO2), Si nitride (SiN), Si oxynitride (SiON), and Si carbide (SiC).

FIG. 12 illustrates second embodiment of present invention having a Ta/EEL 120/335 hard mask for MRAM patterning before etching, wherein the EEL 335 is made of one or more of Si oxide (SiO2), Si nitride (SiN), Si oxynitride (SiON), and Si carbide (SiC). Atop the EEL 335, an optical planarization layer (OPL) 345 is formed, thus forming a tri-layer photoresist element (PRE) atop a hard mask element (HME) for achieving a better light exposure in the patterned PRL 150, wherein the OPL 345 may also be formed by spin-on-coating.

FIG. 13 illustrates second embodiment of present invention having an EEL 335 after etching for transferring a PRL mask 150 to the EEL mask 335.

FIG. 14 illustrates second embodiment of present invention having the mask of Ta after etching for transferring a mask of EEL 335 to the Ta layer 120.

FIG. 15 illustrates second embodiment of present invention after etching MTJ cells 110 at a high power using Ta as hard mask 120 with, indicating a damaged layer 125 surrounding a MTJ cell 110.

FIG. 16 illustrates second embodiment of present invention having a result from removal of wear and tear damage on surfaces and edges including sidewalls of MTJ cells resulted from a patterning process on MTJ cells after CVT.

FIG. 17 illustrates the present invention making protection of the MTJ cells by a layer of Si nitride (SiN) 160.

FIG. 18 illustrates the present invention after filling a layer 170 of SiO2 on top of SiN 160.

FIG. 19 illustrates the present invention making a flat top surface by chemical mechanical polishing (CMP).

FIG. 20 illustrates the present invention forming a pair of SiN 160 and SiO2 170 layers after CMP.

FIG. 21 illustrates the present invention patterning for making a top electrode via (TEV) 180 connected to MTJ cells.

FIG. 22 illustrates the present invention forming a top electrode via (TEV) 180 connected to MTJ cells.

FIG. 23 illustrates the present invention forming top electrode (TE) 190 connected to via(s) (TEV) 180.

FIG. 24 illustrates third embodiment of present invention having a Ta/C/EEL 120/230/335 hard mask for MRAM patterning before etching, wherein the EEL 335 is made of one or more of Si oxide (SiO2), Si nitride (SiN), Si oxynitride (SiON), and Si carbide (SiC).

FIG. 25 illustrates third embodiment of present invention having the EEL 335 mask after etching for transferring a PR mask to the EEL layer 335.

FIG. 26 illustrates third embodiment of present invention having the mask of C 230 after etching for transferring an EEL mask 335 to the C layer 230.

FIG. 27 illustrates third embodiment of present invention having the mask of Ta 120 after etching for transferring a mask of C 230 to the Ta layer 120.

FIG. 28 illustrates third embodiment of present invention after etching MTJ cells 110 at a high power using Ta as hard mask 120 with, indicating a damaged magnetic layer 125 surrounding a MTJ cell 110.

FIG. 29 illustrates third embodiment of present invention having a result from removal of wear and tear damage on surfaces and edges, including side walls, of MTJ cells resulted from a patterning process on MTJ cells after CVT.

FIG. 30 illustrates the present invention forming top electrode (TE) 190 directly connected to MTJ cells without TEV in fourth embodiment.

Figures 1, 2:
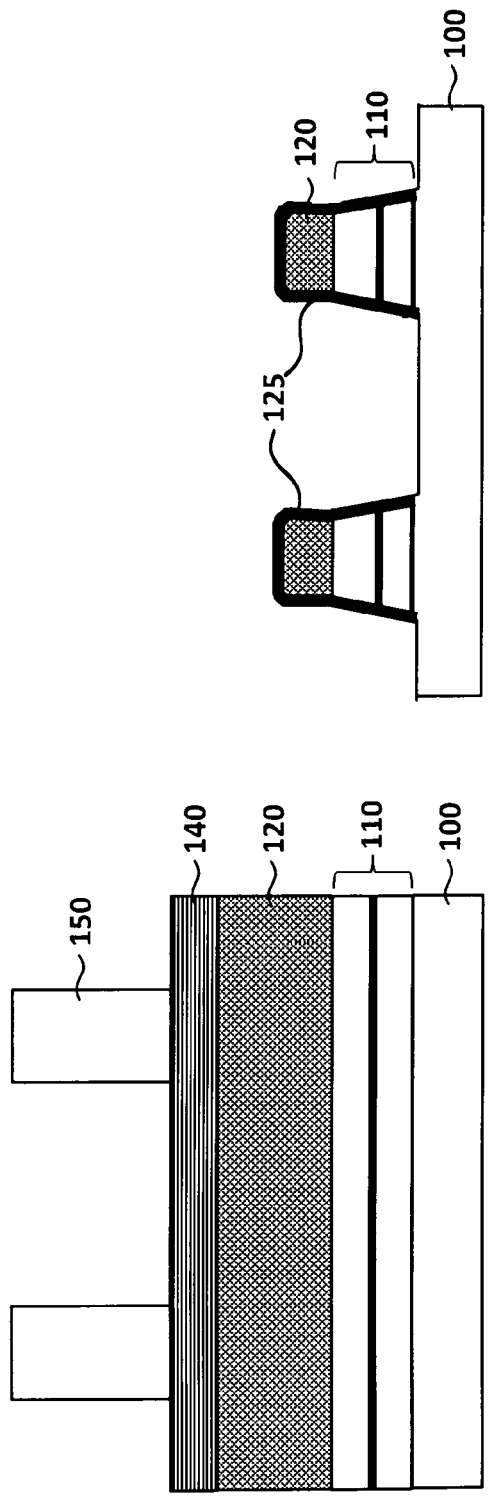
FIG. 1 illustrates a prior art having a photolithography patterning with a patterned photoresist layer (PRL) 150 before hard mask 120 patterning and MTJ 110 etching.
FIG. 2 illustrates a prior art having MTJ cells with a damaged layer 125 surrounding the MTJ surfaces and edges including side walls after an etching process using Ta as hard mask 120.

Table 1 illustrates etching rate for the materials discussed in this invention using CF4 and O2 gas, respectively.

Table 2 illustrates the present invention describing chemical vapor trimming having a list of several volatile magnetic metal carbonyls formed most likely during a chemical vapor trimming (CVT) process, thus can be pumped out of a process chamber.

DETAILED DESCRIPTION OF THE INVENTION

A method of fabricating a magnetic random access memory (MRAM) has steps below,
  forming a MRAM film element (MRAM-FE);
  forming a hard mask element (HME) atop the MRAM-FE;
  forming a photoresist element (PRE) atop the HME;
  patterning the PRE by photolithography or in-print;
  patterning the HME;
  patterning the MRAM-FE;
  applying a chemical vapor trimming (CVT) process on surfaces and edges, including sidewalls, of the patterned MRAM-FE; and
  encapsulating the patterned MRAM-FE by a Si nitride (SiN) layer, whereby producing a MJT cell without damage on surfaces and edges including sidewalls.

The method in present invention is in general suitable for IC fabrication patterning. However, herein, as an example, it is illustrated in MRAM fabrication patterning.

An exemplary embodiment will be described hereinafter with reference to the accompanying drawings. The drawings are schematic or conceptual, and the relationships between the thickness and width of portions, the proportional coefficients of sizes among portions, etc., are not necessarily the same as the actual values thereof.

First Embodiment

Illustrated in FIG. 3-FIG. 7, this embodiment starts from having an MRAM film element (MRAM-FE) 110 atop a bottom electrode (BE) base layer 100 made first, wherein a set of required films stacked one by one for forming a functional foundation of MRAM before an MRAM circuit is fabricated. The BE is made of an electric conductor, such as a metal or an alloy. A step forming a hard mask element (HME) 120/230 starts with forming a metal Ta layer 120 with a thickness between 40-150 nm followed by forming a carbon layer 230 with a thickness between 20-200 nm atop the Ta layer 120. The Ta layer 120 may be formed by approaches including physical vapor deposition (PVD), or ion-beam deposition (IBD) using Ta as a target. The carbon layer 230 is formed by approaches including one or more of the following methods a). chemical vapor deposition (CVD) using reactants comprising C, H, and O; b). a spin-on-Carbon coating; c). PVD using carbon as a target; and d). IBD using carbon as a target. Then an antireflection layer (ARL) 140 and a photoresist layer (PRL) 150 are formed by spin-coating atop of the carbon layer of HME thus forming a bi-layer photoresist element (PRE) atop the HME 120/230.

Next, the PRL 150 is patterned, as shown in FIG. 4, either by photolithography with the help of ARL or in-print with a mask mold followed by patterning the ARL 140 with etching. Thus, the bi-layer PRE is patterned. Then using patterned PRE as a mask, the carbon layer 230 of HME is patterned, as shown in FIG. 5, by O2, O2+Ar, or O2+CF4+Ar ashing. Then the Ta layer 120 of the HME is patterned, as shown in FIG. 6, by reactive ion etching (RIE) with gases comprising CF4 or a mixture of CF4, C, F, and H, using the patterned carbon 230 as a hard mask followed by ashing the remained carbon layer 230 atop the Ta layer 120 of HME by O2. Next, the MRAM film element (MRAM-FE) 110 atop the BE 100 is patterned by etching using gases containing methanol (CH3OH), ethanol (C2H5OH), a mixture of CO and NH4, or Chlorine (Cl) as etchant(s), using the patterned Ta layer 120 as a hard mask. Thus, a patterned MRAM-FE with wear and tear damages 125, from patterning, on MTJ surfaces and edges including sidewalls are formed, as shown in FIG. 7, above the BE 100.

Then, as shown in FIG. 8 and Table 2 a chemical vapor trimming (CVT) process is applied on surfaces and edges including sidewalls of the patterned MRAM-FE. The CVT process is applied at low power to mildly remove a layer of particles of wear and tear, from patterning, surrounding the post-patterning surfaces and edges including sidewalls for achieving improved device performance. The CVT process uses molecules of at least one of carbon monoxide (CO), alcohols, and carbonyl, wherein alcohols and carbonyl are in one or more of their various forms, preferably ethanol (C2H5OH) and acetic acid (CH3COOH) respectively, for extracting particles of loosen metal or metal oxide wear and tear, from patterning, on exposed surfaces and edges including sidewalls of the patterned MRAM-FE to form volatile metal carbonyls. The CVT process is conducted at a temperature such that the formed metal carbonyls are in their vapor state (volatile) and thus subsequently are pumped out of the process chamber. Thus, a patterned MRAM-FE having magnetically isolated MTJ cells without damage on surface and edge including side walls is formed, as shown in FIG. 9, above the BE 100.

Then, as shown in FIG. 10, the patterned MRAM-FE is immediately encapsulated by depositing a Si nitride (SiN) layer 160 on it with a plasma-enhanced chemical vapor deposition (PECVD) process for protecting surfaces of MTJ cells or MRAM elements, whereby producing a desired MJT cell without damage on surfaces and edges including sidewalls but with larger magnetoresistance, better performance, and better reliability.

Second Embodiment

As another example, alternatively illustrating the method in present invention, as shown in FIG. 11-FIG. 16, an MRAM film element (MRAM-FE) 110 atop the BE 100 is made first, wherein a set of required films stacked one by one for forming a functional foundation of MRAM before an MRAM circuit is fabricated. A step forming a hard mask element (HME) starts with forming a metal Ta layer 120 with a preferred thickness between 40-150 nm. The next step is forming an etching enhancement layer (EEL) 335 made of one or more of Si oxide (SiO2), Si nitride (SiN), Si oxynitride (SiON), and Si carbide (SiC), atop the carbon layer 230, with a preferred thickness of 50-200 nm. The SiO2 layer of the EEL 335 in HME is formed by approaches including one or more of the following: a). CVD using reactants comprising Si, H, and O; b). spin-on-SiO coating; c). PVD using Si or SiO2 as a target with Ar or Ar+O2 gas(es); and d). IBD using SiO2 as a target. The SiN layer of the EEL 335 in the HME is formed by approaches including one or more of the following: a). CVD using reactants comprising Si, N, and H; and b). PVD using Si as a target with Ar+N2 or Ar+NH4 gases. The SiON layer of EEL 335 in the HME is formed by approaches including one or more of the following: a). CVD using reactant(s) comprising Si, O, N, and H; and b). PVD, using Si as a target with gases comprising Ar, O, and N. The SiC layer of the EEL 335 in the HME is formed by approaches including one or more of the following: a). CVD using reactants comprising Si, C, and H; b). PVD using SiC as a target; and c). IBD using SiC as a target. Then as shown in FIG. 11, an antireflection layer (ARL) 140 is formed atop of the ELL layer 335 of the HME followed by forming a photoresist layer (PRL) 150 atop the ARL 140, wherein both the PRL 150 and the ARL 140 may be formed by spin-on-coating. Alternatively, as shown in FIG. 12, an optical planarization layer (OPL) 345 is formed atop the EEL 335 thus forming a tri-layer photoresist element (PRE) atop the HME for achieving a better light exposure in the PRL 150, wherein the OPL 345 may also be formed by spin-on-coating.

Next, the PRL 150 is patterned, as shown in FIG. 11 and FIG. 12, either by photolithography or in-print with a mold followed by patterning ARL 140 and OPL 345 by etching using the patterned PRL 150 as a mask. Next steps include a). patterning the EEL 335 of the HME by reactive ion etch (RIE) with reactant gas(es) containing CF4 or a mixture of CF4, C, F, and H, using the patterned PRE as a mask as shown in FIG. 13; b). patterning the Ta layer 120 of the HME by RIE with reactant gas(es) containing CF4 or a mixture of CF4, C, F, and H, using the patterned EEL 335 as a hard mask as shown in FIG. 14. Table 1 illustrates etching rate using CF4 gas and ashing rate using O2 gas for each mask material in the present invention.

Next, using the Ta layer 120 as a hard mark, the MRAM film element (MRAM-FE) is patterned as shown FIG. 15 by reactive ion etching (RIE) using reactant gas(es) including one or more of CH3OH, CH5OH, a mixture of CO and NH4, and Chlorine (Cl).

Then a chemical vapor trimming (CVT) process similar to the one described in the first embodiment is performed to remove the damaged layer surrounding the etched surface and edges including sidewalls to achieve better device performance. The above CVT process is used for more than one time and, in between a time and its subsequent time of applying the CVT process, a bombardment process using argon ions and oxygen ions is applied for forming a layer of loosen metal oxide on exposed surfaces and edges including sidewalls of the patterned MRAM for better facilitating CVT extractions, whereby a patterned MRAM-FE having magnetically isolated MTJ cells without damage of surfaces and edges including sidewalls is produced, as shown in FIG. 16, above the BE 100.

Then, as shown in FIG. 17, the patterned MRAM-FE is immediately encapsulated by depositing a Si nitride (SiN)

layer 160 on it with a plasma-enhanced chemical vapor deposition (PECVD) process for protecting surfaces including of MTJ cells or MRAM elements, whereby producing a desired MJT cell without damage 125 on surfaces and edges including sidewalls.

As shown in FIG. 18 a thick layer of SiO2 170 is filled atop the SiN layer by PECVD. Thereafter, a CMP process is used for flattening the surfaces of MTJ cells as shown in FIG. 19. Then a pair of SiN & SiO2 film stack 160/170 is deposited by PECVD on the smooth surfaces and edges of MTJ as shown in FIG. 20. As shown in FIG. 21 and FIG. 22, a next step in the present invention forms via(s) (TEV) 180 connected to MTJ cells. Then a next step is to form a top electrode (TE) 190 connected to via(s) (TEV) 180 as shown in FIG. 23, thus MRAM cells are made of MTJ cells without damage on side walls and edges but with larger magnetoresistance, better performance, and better reliability.

Third Embodiment

As another example, alternatively illustrating the method in present invention, as shown in FIG. 24-FIG. 29, an MRAM film element (MRAM-FE) 110 atop the BE 100 is made first, wherein a set of required films stacked one by one for forming a functional foundation of MRAM before an MRAM circuit is fabricated. A step forming a hard mask element (HME) starts with forming a metal Ta layer 120 with a preferred thickness between 50-150 nm followed by forming a carbon 230 with a preferred thickness between 20-200 nm atop the Ta layer 120, that is formed by approaches including PVD, or IBD using C as a target. The next step is forming an etching enhancement layer (EEL) 335 made of one or more of Si oxide (SiO2), Si nitride (SiN), Si oxynitride (SiON), and Si carbide (SiC), atop the carbon layer 230, with a preferred thickness of 40-200 nm. The SiO2 layer of the EEL 335 in HME is formed by approaches including one or more of the following: a). PECVD using reactants comprising Si, H, and O; b). spin-on-SiO coating; c). PVD using Si or SiO2 as a target with Ar or Ar+O2 gas(es); and d). IBD using SiO2 as a target. The SiN layer of the EEL 335 in the HME is formed by approaches including one or more of the following: a). PECVD using reactants comprising Si, N, and H; and b). PVD using Si as a target with Ar+N2 or Ar+NH4 gases. The SiON layer of EEL 335 in the HME is formed by approaches including one or more of the following: a). PECVD using reactant(s) comprising Si, O, N, and H; and b). PVD, using Si as a target with gases comprising Ar, O, and N. The SiC layer of the EEL 335 in the HME is formed by approaches including one or more of the following: a). PECVD using reactants comprising Si, C, and H; b). PVD using SiC as a target; and c). IBD using SiC as a target, wherein the OPL 345 may also be formed by spin-on-coating. Then an optical planarization layer (OPL) 345 is formed atop the EEL 335 layer of the HME followed by forming a antireflection layer (ARL) 140 atop the OPL 345 and photoresist layer (PRL) 150 atop the ARL 140, wherein the OPL, ARL and PR may be formed by spin-on-coating, thus forming a tri-layer photoresist element (PRE) atop the HME for achieving a better light exposure in the PRL 150.

Next, the PRL 150 is patterned, as shown in FIG. 24, either by photolithography or in-print with a mold followed by patterning ARL 140 and OPL 345 by etching using the patterned PRL 150 as a mask. Next steps include a). patterning the EEL 335 of the HME by reactive ion etch (RIE) with reactant gas(es) containing CF4 or a mixture of CF4, C, F, and H, using the patterned PRE as a mask, as shown in FIG. 25; b). patterning the carbon layer 230 of HME by O2, or O2+Ar ashing using the patterned EEL 335 as a hard mask, as shown in FIG. 26; c). patterning the Ta layer 120 of the HME by RIE with reactant gas(es) containing CF4 or a mixture of CF4, C, F, and H, using the patterned carbon 230 as a hard mask followed by ashing the remained carbon layer 230 atop the Ta layer 120 of HME by O2 as shown in FIG. 27. Table 1 illustrates etching rate using CF4 gas and ashing rate using O2 gas for each targeted material in the present invention.

Next, using the Ta layer 120 as a hard mark, the MRAM film element (MRAM-FE) is patterned as shown in FIG. 28 by reactive ion etching (RIE) using reactant gas(es) including one or more of CH3OH, CH5OH, a mixture of CO and NH4, and Chlorine (Cl).

Then a chemical vapor trimming (CVT) process similar to the one described in the first embodiment is performed to remove the damaged layer surrounding the etched surface and edges including sidewalls to achieve better device performance. The above CVT process is used for more than one time and, in between a time and its subsequent time of applying the CVT process, a bombardment process using argon ions and oxygen ions is applied for forming a layer of loosen metal oxide on exposed surfaces and edges including sidewalls of the patterned MRAM for better facilitating CVT extractions, whereby a patterned MRAM-FE having magnetically isolated MTJ cells without damage of surfaces and edges including sidewalls is produced, as shown in FIG. 29, above the BE 100.

Then, as shown in FIG. 17, the patterned MRAM-FE is immediately encapsulated by depositing a Si nitride (SiN) layer 160 on it with a plasma-enhanced chemical vapor deposition (PECVD) process for protecting surfaces including of MTJ cells or MRAM elements, whereby producing a desired MJT cell without damage 125 on surfaces and edges including.

As shown in FIG. 18 a thick layer of SiO2 170 is filled atop the SiN layer by PECVD. Thereafter, a CMP process is used for flattening the surfaces of MTJ cells as shown in FIG. 19. Then a pair of SiN & SiO2 film stack 160/170 is deposited by PECVD on the smooth surfaces and edges of MTJ as shown in FIG. 20. As shown in FIG. 21 and FIG. 22, a next step in the present invention forms via(s) (TEV) 180 connected to MTJ cells. Then a next step is to form a top electrode (TE) 190 connected to via(s) (TEV) 180 as shown in FIG. 23, thus MRAM cells are made of MTJ cells without damage on sidewalls and edges but with larger magnetoresistance, better performance, and better reliability.

Fourth Embodiment

In this embodiment, patterning processes and CMP process(es) are the same as that in Third Embodiments. Right after the CMP flattening of the MTJ top surface as shown in FIG. 19, the process of forming a TEV and a TE in Third Embodiment is replaced by a process of forming a TE directly in contact with the top surface of MTJ without any TEV, as shown in FIG. 30.

The above detailed descriptions are merely illustrative in nature and are not intended to limit the embodiment of the subject matter or the application and uses of such embodiment. Indeed, the novel embodiment described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A method of fabricating a magnetic random access memory (MRAM) comprising steps below,
   forming a MRAM film element (MRAM-FE);
   forming a hard mask element (HME) atop the MRAM-FE;
   forming a photoresist element (PRE) atop the HME;
   patterning the PRE by photolithography or in-print;
   patterning the HME;
   patterning the MRAM-FE;
   applying a chemical vapor trimming (CVT) process on surfaces and edges including the sidewall of the patterned MRAM-FE; and
   encapsulating the patterned MRAM-FE by a Si nitride (SiN) layer, whereby producing a MJT cell without sidewall damage.

2. The method of claim 1, wherein forming an MRAM-FE comprising
   forming a bottom electrode (BE) base layer, an electric conductive layer; and
   forming a magnetic memory function element (MMFE) atop the BE.

3. The method of claim 2, wherein forming an MMFE comprising,
   forming a magnetic memory layer atop the BE;
   forming a magnetic tunneling layer atop the magnetic memory layer; and
   forming a magnetic reference layer atop the tunneling layer.

4. The method of claim 2, wherein forming an MMFE, alternatively, comprising
   forming a magnetic reference layer atop the BE;
   forming a magnetic tunneling layer atop the magnetic reference layer; and
   forming a magnetic memory layer atop the tunneling layer.

5. The method of claim 1, wherein forming an HME comprising
   forming a Ta layer atop the MRAM-FE, with a thickness between 40-150 nm; and
   forming a carbon layer atop the Ta layer, with a thickness between 20-200 nm.

6. The method of claim 5, wherein forming a carbon layer in HME comprising one or more of the following approaches:
   a). employing chemical vapor deposition (CVD) using reactants comprising C, H, and O;
   b). employing a spin-on-Carbon layer;
   c). employing physical vapor deposition (PVD) deposition using carbon as a target; and
   d). employing ion-beam deposition (IBD) using carbon as a target.

7. The method of claim 1, forming a PRE comprising
   forming an antireflection layer (ARL) atop the HME;
   forming a photoresist layer (PRL) atop the ARL; and
   patterning the PRL by photolithography or in-print; and
   etching ARL and thus forming a patterned PRE.

8. The method of claim 1, wherein patterning an HME comprising
   patterning the carbon layer of the HME by ashing with gas(es) comprising one or more of O2, O2+Ar, and O2+CF4+Ar, using the patterned PRE as a mask;
   patterning the Ta layer of the HME by reactive ion etching (RIE) with gas(es) comprising one or both of CF4 and a mixture of CF4, C, F, and H, using the patterned carbon as a hard mask; and
   ashing the remained carbon layer atop the Ta layer of HME by O2.

9. The method of claim 1, wherein patterning a MRAM-FE comprising etching the MRAM-FE by high power RIE with gas(es) comprising one or more of methanol (CH3OH), ethanol (C2H5OH), a mixture of CO and NH4, and Chlorine (Cl), using the patterned Ta layer as a hard mask.

10. The method of claim 1, wherein the CVT process is applied at low power to mildly remove a layer of materials of wear and tear, from patterning, surrounding the post-patterning surfaces and edges including the sidewall for achieving improved device performance.

11. The method of claim 1, wherein the CVT process uses molecules of at least one of carbon monoxide (CO), alcohols, and carbonyl, wherein alcohols and carbonyl are in one or more of their various forms, preferably ethanol (C2H5OH) and acetic acid (CH3COOH) respectively, for extracting materials of loosen metal or metal oxide wear and tear, from patterning, on exposed sidewall of the patterned MRAM-FE to form volatile metal carbonyls.

12. The method of claim 1, wherein the CVT process is conducted at a temperature such that the formed metal carbonyls are in their vapor state (volatile) and thus subsequently are pumped out of a process enclosure.

13. The method of claim 1, wherein the CVT process is used for one or more times and, in between a time and its subsequent time of applying the CVT process, a bombardment process using argon ions and oxygen ions is applied for forming a layer of loosen metal oxide on exposed sidewall of the patterned MRAM for better facilitating CVT extractions, whereby wear-and-tear-free sidewall of a MTJ or a MRAM element is achieved thus a damage-free MTJ or MRAM element is produced.

14. The method of claim 1, wherein encapsulating the patterned MRAM-FE by a Si nitride (SiN) layer is done by a plasma-enhanced chemical vapor deposition (PECVD) process for protecting surfaces, especially sidewalls, of the MTJ or MRAM element, whereby producing a MTJ or MRAM element with larger magnetoresistance, better performance, and better reliability.

* * * * *